US012742753B2

(12) United States Patent
Taniguchi

(10) Patent No.: US 12,742,753 B2
(45) Date of Patent: Sep. 22, 2026

(54) ELECTRICAL CONDUCTIVITY DETECTOR WITH PHASE DIFFERENCE CORRECTION

(71) Applicant: SHIMADZU CORPORATION, Kyoto (JP)

(72) Inventor: Hiroki Taniguchi, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 159 days.

(21) Appl. No.: 18/777,589

(22) Filed: Jul. 19, 2024

(65) Prior Publication Data

US 2025/0027912 A1 Jan. 23, 2025

(30) Foreign Application Priority Data

Jul. 21, 2023 (JP) ................................ 2023-118845

(51) Int. Cl.

*G01N 30/64* (2006.01)
*G01N 27/04* (2006.01)
*G01N 27/06* (2006.01)
*G01R 25/00* (2006.01)

(52) U.S. Cl.

CPC ............ *G01N 30/64* (2013.01); *G01R 25/00* (2013.01); *G01N 27/045* (2013.01); *G01N 27/06* (2013.01); *G01N 2030/645* (2013.01)

(58) Field of Classification Search

CPC ............ G01N 30/64; G01N 2030/645; G01N 27/045; G01N 27/06; G01N 30/96; G01R 25/00
USPC .......................................................... 324/439
See application file for complete search history.

(56) References Cited

U.S. PATENT DOCUMENTS

2002/0067174 A1* 6/2002 McAllister ......... G01N 27/4473 324/690
2012/0024043 A1* 2/2012 McBrady .............. G01N 30/66 73/25.03
2012/0068723 A1* 3/2012 Sullivan ................ G01N 27/07 324/654
2015/0292960 A1* 10/2015 Schmidt ................ G01K 17/00 702/136
2016/0103105 A1* 4/2016 Nakama ................ G01N 30/62 73/23.4

(Continued)

FOREIGN PATENT DOCUMENTS

WO 2017/208561 A1 12/2017

*Primary Examiner* — Raul J Rios Russo
(74) *Attorney, Agent, or Firm* — Muir Patent Law, PLLC

(57) ABSTRACT

An electrical conductivity detector is provided with a waveform output unit for supplying an AC signal to a measurement target and a controller for controlling the waveform output unit. The controller executes processing for multiplying the detected wave obtained when the AC signal passes through the measurement target by a reference wave. The controller causes the waveform output unit to generate a waveform with a dummy peak superimposed on an input wave and executes processing for detecting a phase difference. The controller causes the waveform output unit to generate a waveform with no dummy peak superimposed on the input wave and executes processing for correcting the phase difference with respect to the reference wave to calculate the electrical conductivity based on a result of the multiplication processing.

9 Claims, 6 Drawing Sheets

(56) References Cited

U.S. PATENT DOCUMENTS

| | | | | |
|---|---|---|---|---|
| 2016/0341681 | A1* | 11/2016 | Gellert | G01N 30/66 |
| 2020/0319147 | A1 | 10/2020 | Sawata | |

* cited by examiner 1
11
D/A
121
12
Cell
122
13
Amplifier
14
A/D
Sine wave data
101
Sine wave data output unit
102
Phase difference detection unit
103
Phase correction unit
104
Square wave data output unit
105
106
Integration unit
107
Filter unit
108
Electrical conductivity calculation unit
Controller
100
Electrical conductivity

FIG. 2

Driving wave
Measure-
ment
target
Detected wave
Reference wave
Calculation
(Area value calculation)
Electrical
conductivity

ELECTRICAL CONDUCTIVITY DETECTOR WITH PHASE DIFFERENCE CORRECTION

CROSS-REFERENCE TO RELATED APPLICATIONS

This application claims priority under 35 U.S.C. § 119 to Japanese Patent Application No. 2023-118845 filed on Jul. 21, 2023, the entire disclosure of which is incorporated herein by reference in its entirety.

BACKGROUND OF THE INVENTION

Field of the Invention

The present disclosure relates to an electrical conductivity detector.

Description of the Related Art

The following description sets forth the inventor's knowledge of the related art and problems therein and should not be construed as an admission of knowledge in the prior art.

An electrical conductivity detector is used, for example, as a detector for detecting each component (ion) of a sample separated by a column in an ion chromatograph. In an electrical conductivity detector, a voltage is applied between a pair of electrodes positioned across a flow path of an eluent (sample solution) from an ion chromatograph, and the current flowing between the two electrodes is measured. With this, the electrical conductivity of the eluate flowing between the electrodes is calculated, and the electrical conductivity detector detects the components separated by the ion chromatograph based on the electrical conductivity.

If the voltage applied between the two electrodes is a DC voltage, polarization occurs between the electrodes, making it impossible to accurately measure the electrical conductivity. Therefore, an AC voltage (e.g., a sine wave) with a constant amplitude and frequency is used as the voltage.

International Publication WO 2017/208561 discloses a measuring instrument as one example of such an electrical conductivity detector. The measuring instrument is provided with a sensor unit for outputting an AC signal, a reference signal output unit for outputting a reference signal having the same frequency and phase as the AC signal, a multiplier for multiplying the AC signal and the reference signal, an A/D converter arranged before or after the multiplier, and an integration unit for integrating a digital signal which is an output of the multiplier.

SUMMARY OF THE INVENTION

The preferred embodiments of the present disclosure have been developed in view of the above-mentioned and/or other problems in the related art. The preferred embodiments of the present disclosure can significantly improve upon existing methods and/or apparatuses.

There are some electrical conductivity detectors that perform a lock-in measurement. When performing a lock-in measurement, processing is executed in which the detected wave and a reference wave (which is the same in frequency and phase as a driving wave) are multiplied together. Depending on the measurement target, a phase difference may occur between the detected wave and the reference wave, sometimes resulting in a phase error in the multiplication result. For this reason, the phase difference between the driving wave (reference wave) and the detected wave is calculated, and the phase of the reference wave is made to be aligned with that of the detected wave to eliminate the above phase error. However, noise components may be superimposed on the driving wave, making it difficult to detect the phase difference accurately, which may sometimes result in reduced accuracy of the electrical conductivity detection.

The purpose of the present disclosure is to provide an electrical conductivity detector that solves the above-described problems and is less susceptible to noise.

The first aspect of the present disclosure relates to an electrical conductivity detector. The electrical conductivity detector is equipped with a waveform output unit for supplying an AC signal to a measurement target and a controller for controlling the waveform output unit.

The controller is configured to execute multiplication processing for multiplying a detected wave obtained when the AC signal passes through the measurement target by a reference wave for detecting the electrical conductivity. The controller is configured to cause the waveform output unit to generate a waveform with a dummy peak superimposed on an input wave as an AC signal and execute phase difference detection processing for detecting a phase difference between the detected wave and the AC signal acquired correspondingly. The controller is configured to cause the waveform output unit to generate a waveform with no dummy peak superimposed on the input wave as an AC signal, execute processing for correcting the phase difference with respect to the reference wave, and execute electrical conductivity calculation processing for calculating the electrical conductivity based on a results of the multiplication processing.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present disclosure are shown by way of example, and not limitation, in the accompanying figures.

FIG. 2 is a diagram for explaining a lock-in measurement in the presence of a phase error.

DETAILED DESCRIPTION OF THE PREFERRED EMBODIMENTS

In the following paragraphs, some preferred embodiments of the present disclosure will be described by way of example and not limitation. It should be understood based on this disclosure that various other modifications can be made by those in the art based on these illustrated embodiments.

Hereinafter, some embodiments of the present disclosure will be described in detail with reference to the attached drawings. Note that the same or equivalent part in the figures is assigned by the same reference symbol, and the description will not be repeated.

Figure 1:
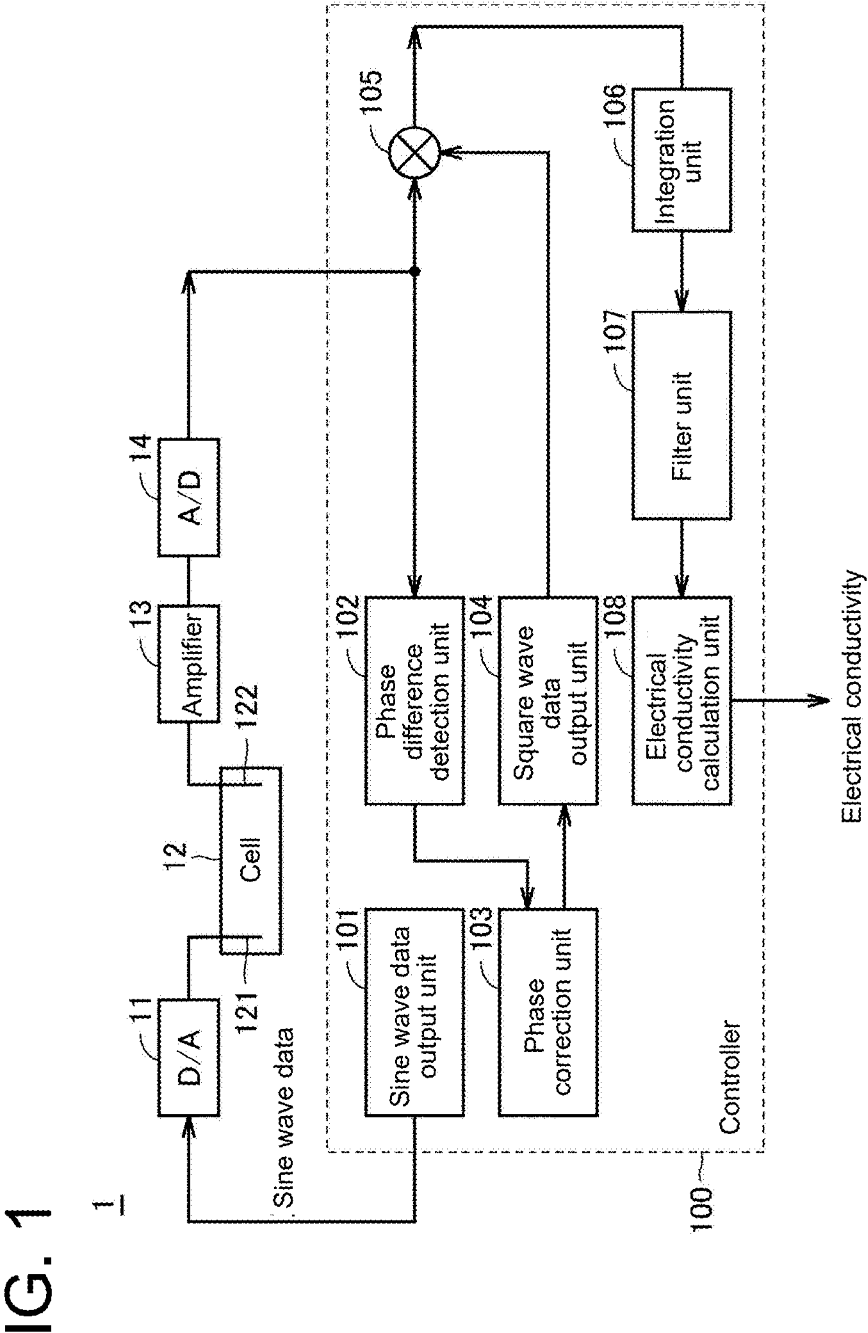
FIG. 1 is a block diagram showing the structure of the electrical conductivity detector according to an embodiment of the present disclosure.

FIG. 1 is a block diagram showing the structure of the electrical conductivity detector according to an embodiment of the present disclosure. The electrical conductivity detector 1 shown in FIG. 1 is equipped with a D/A converter 11, a cell 12, an amplifier 13, an A/D converter 14, and a controller 100 that controls the waveform output unit (D/A converter 11). The D/A converter 11 functions as a waveform output unit that supplies an AC signal to a measurement target. The cell 12 accommodates a sample solution which is a measurement target. The amplifier 13 amplifies a detected wave. The A/D converter converts the output of the amplifier 13 into a digital signal.

The controller 100 is configured, for example, by at least one CPU (Central Processing Unit), at least one ASIC (Application Specific Integrated Circuit), at least one FPGA (Field Programmable Gate Array), or a combination thereof.

The controller 100 includes a storage device. The storage device includes, for example, a ROM (Read Only Memory), a RAM (Random Access Memory), a non-volatile memory, an SSD (Solid State Drive), or a hard disk. In the storage device, programs for realizing various processing are stored. The controller 100 realizes the following various processing by executing the programs stored in the storage device.

The controller 100 is configured to execute multiplication processing for multiplying the detected wave obtained by passing an AC signal through the measurement target (the sample solution in the cell 12) by a reference wave for detecting the electrical conductivity. The multiplication processing is executed by the multiplier 105.

The controller 100 is configured to cause the waveform output unit to generate a waveform with a dummy peak superimposed on the an wave as an AC signal and execute phase difference detection processing for detecting the phase difference between the detected wave and the AC signal acquired correspondingly. The phase difference detection processing is executed by the phase difference detection unit 102.

The controller 100 is configured to cause the waveform output unit to generate a waveform with no dummy peak superimposed on the input wave as an AC signal and execute processing for correcting the phase difference with respect to the reference wave. The processing for correcting the phase difference is executed by the phase correction unit 103.

The controller 100 is configured to execute electrical conductivity calculation processing for calculating the electrical conductivity based on the result of the multiplication processing. The electrical conductivity calculation processing is executed by the electrical conductivity calculation unit 108 after the output of the multiplier 105 is integrated by the integration unit 106, and the numerical values are smoothed by the filter unit 107.

According to the electrical conductivity detector 1, the accuracy of the correction for aligning the phase of the reference wave with the detected wave is improved by the phase correction unit 103, so the electrical conductivity can be detected with high accuracy.

Figure 2:
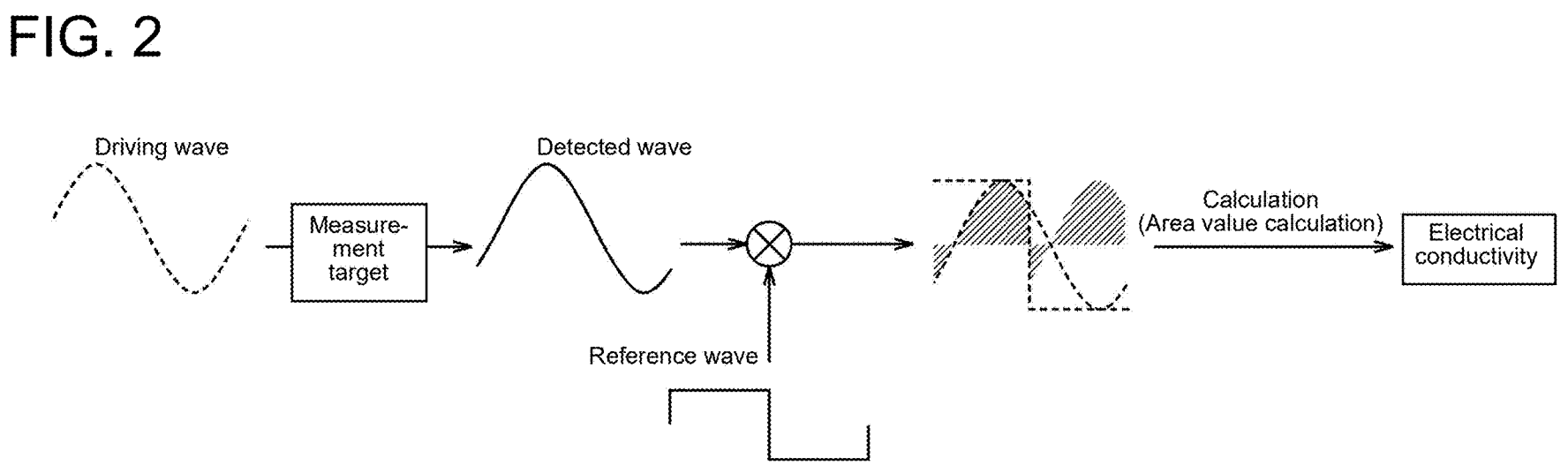
Figure 3:
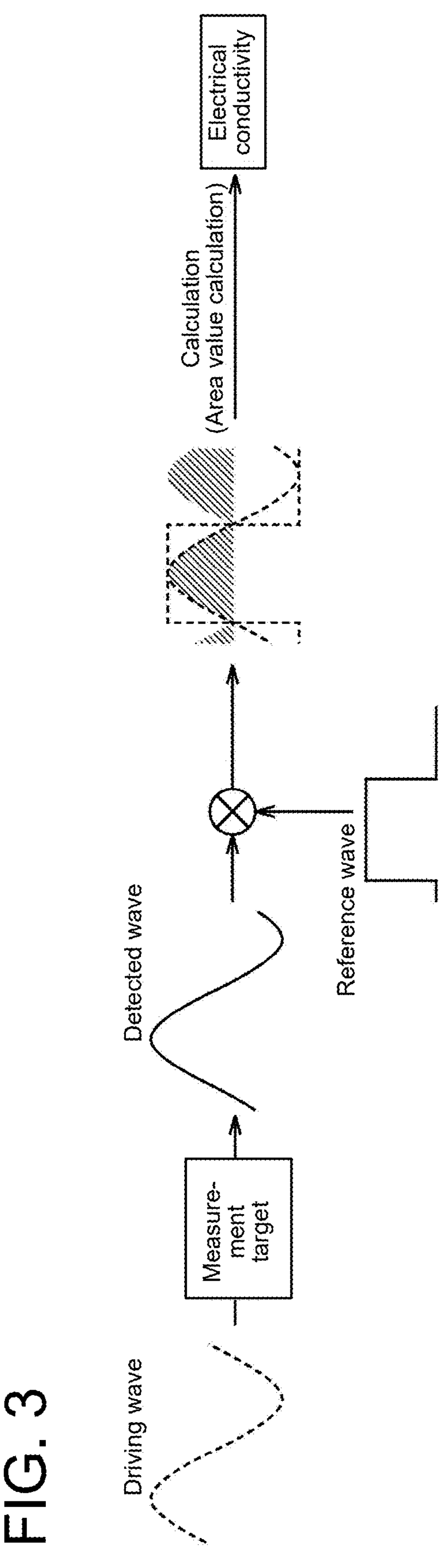
FIG. 3 is a diagram for explaining a lock-in measurement in the absence of a phase error.

The details of the phase correction will be explained below. An electrical conductivity detector typically performs a lock-in measurement. FIG. 2 is a diagram for explaining a lock-in measurement in the presence of a phase error. FIG. 3 is a diagram for explaining a lock-in measurement in the absence of a phase error.

As shown in FIG. 2 and FIG. 3, a fixed frequency sine wave is often used for a driving wave. In the configuration shown in FIG. 1, the D/A converter 11 is used to generate the sine wave, and the A/D converter 14 is used to read the waveform.

In the case of single-phase detection, the detected wave and the reference wave (which has the same frequency and phase as the driving wave) are multiplied by the multiplier 105. However, as shown in FIG. 2, depending on the measurement target, a phase difference occurs between the detected wave and the reference wave, causing an error in the calculation result.

Figure 4:
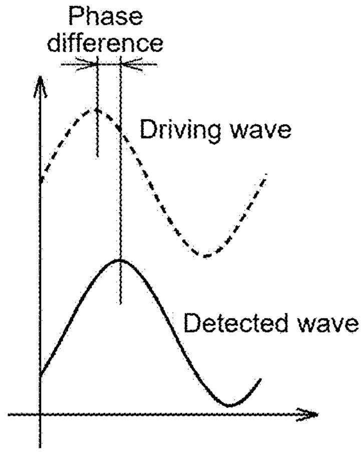
FIG. 4 is a diagram for explaining a phase difference.

FIG. 4 is a diagram for explaining the phase difference. As shown in FIG. 4, the phase difference between the peak of the driving wave (or reference wave) and the peak of the detected wave is usually calculated through peak detection processing before measurement, and the time corresponding to the phase difference is corrected to align the phase of the reference wave with that of the detected wave to eliminate the above error.

As shown in FIG. 2, in the case where there is a phase difference between the driving wave (=the reference wave) and the detected wave, a correct calculation result cannot be obtained. The phase shift causes a portion of the reference wave and the detected wave to have different signs, and the correct area cannot be obtained by integrating the multiplication result. On the other hand, as shown in FIG. 3, in the case where there is no phase difference between the driving wave (=the reference wave) and the detected wave, the correct calculation result is obtained.

Therefore, normally, by detecting the phase difference through peak detection processing before the measurement and feeding back the detected phase difference to the reference wave to change from the state in FIG. 2 to the state in FIG. 3, the correct calculation result can be obtained.

Figure 5:
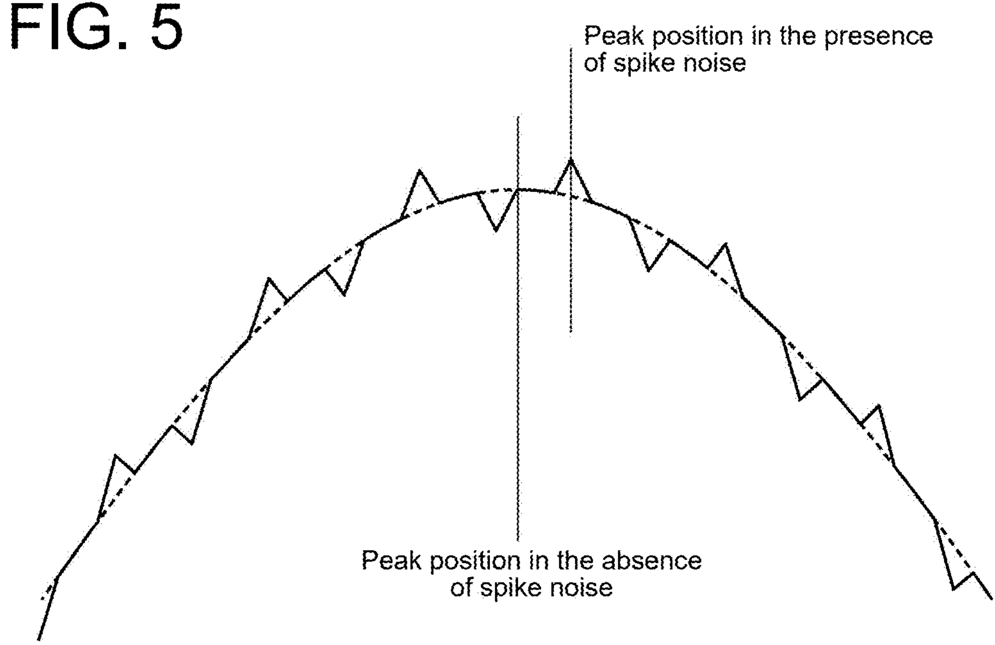
FIG. 5 is a diagram for explaining the effect of spike noise on the peak position.

However, in the case of using an inexpensive D/A converter, spike noise may be introduced into the output voltage. FIG. 5 is a diagram for explaining the effect of spike noise on the peak position. In FIG. 5, a driving wave (see the solid line) with spike noise and a driving wave (see the dashed line) without spike noise are shown in a superimposed manner. As shown in FIG. 5, the peak position changes depending on the presence or absence of spike noise, and therefore, the presence of spike noise causes an error in the peak detection of the sine wave.

Therefore, an error occurs at the time of the peak detection shown in FIG. 4. This results in a phase error, and the phase error directly results in an error in the electrical conductivity.

Since spike noise is averaged over the sampling time of the A/D converter to form a broad peak, there are many situations where processing using a general threshold determination is difficult in the case where, e.g., the amplitude of the detected wave is small. On the other hand, the error can be corrected by using a glitch-free D/A converter that does not generate spike noise, but such a D/A converter is expensive.

Further, it is possible to reduce spike noise by providing an analog filter at the output unit of the D/A converter, but it is necessary to consider the delay and the attenuation of the detection signal due to the filter. Moreover, it leads to an increase in cost due to the addition of components.

Figure 6:
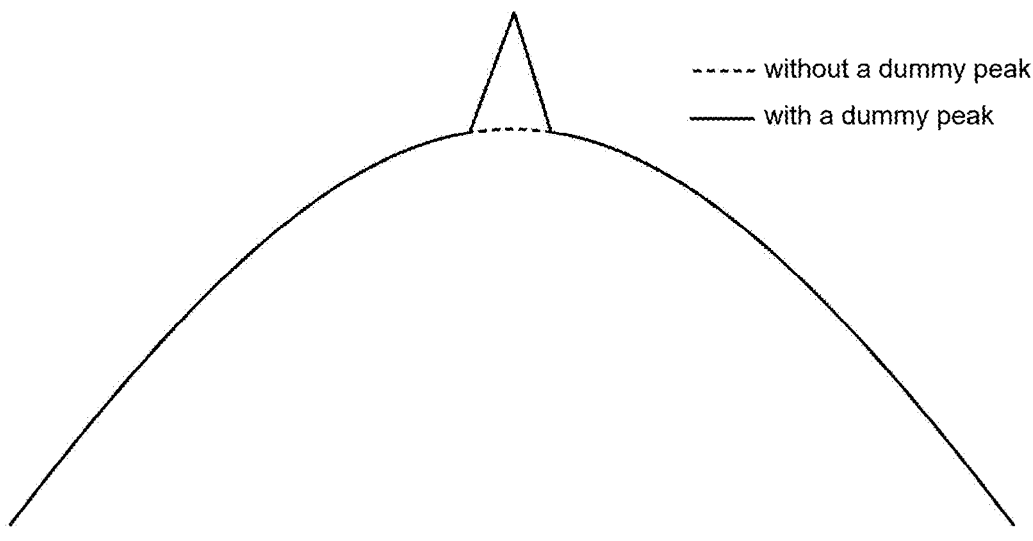
FIG. 6 is a diagram showing one example of a shape of a dummy peak.
Figure 7:
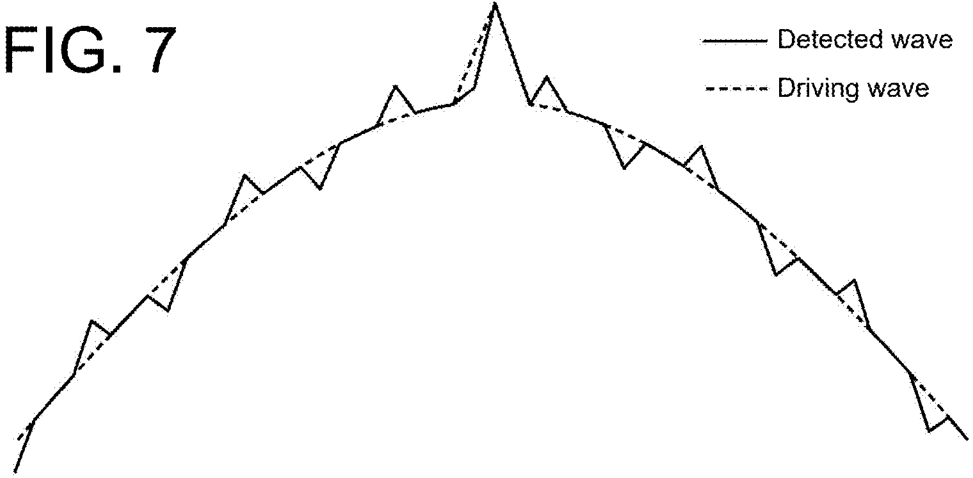
FIG. 7 is a diagram showing the relation between a spike noise and a dummy peak.

Therefore, when detecting a phase difference, a dummy peak is used in the electrical conductivity detector of this embodiment. FIG. 6 is a diagram showing one example of a shape of a dummy peak. FIG. 7 is a diagram showing the relation between a spike noise and a dummy peak.

In this embodiment, at the time of executing peak detection processing, the sine wave data output unit 101 generates data so that a dummy peak with an amplitude larger than the spike noise is added to the output signal of the D/A converter 11. As shown in FIG. 7, since the amplitude of the dummy peak is larger than that of the spike noise, the peak position will not be displaced due to the spike noise when peak detection is performed. On the other hand, at the time of normal measurement, sine wave data without a dummy peak is used, so there is no effect on the analysis result.

The amplitude of the dummy peak can be greater than the amplitude of the assumed spike noise and smaller than the amplitude of the AC signal, which is the input wave. For example, the amplitude of the dummy peak can be set to be 5% or more and 15% or less of the amplitude of the AC signal. More specifically, the amplitude of the dummy peak can be 10%.

Figure 8:
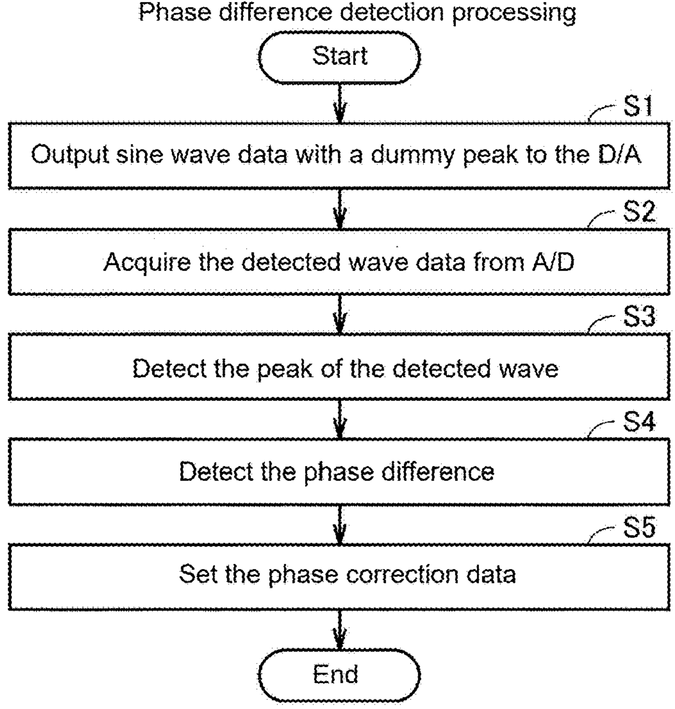
FIG. 8 is a flowchart for explaining the details of the phase difference detection processing.

FIG. 8 is a flowchart for explaining the details of the phase difference detection processing.

Initially, in Step S1, the controller 100 outputs the sine wave data with a dummy peak to the D/A converter 11. In Step S2, the controller 100 acquires the data of the detected wave from the A/D converter 14.

Subsequently, in Step S3, the controller 100 performs the peak detection of the detected wave. In the peak detection, the controller 100 detects the time when the data value of the waveform converted into a numerical value by the A/D converter 14 is maximum. Then, in Step S4, the controller 100 calculates the phase difference (or the delay time) from the difference between the time of the peak of the input wave and the time of the peak of the detected wave and sets the phase difference as the phase correction data in Step S5.

Figure 9:
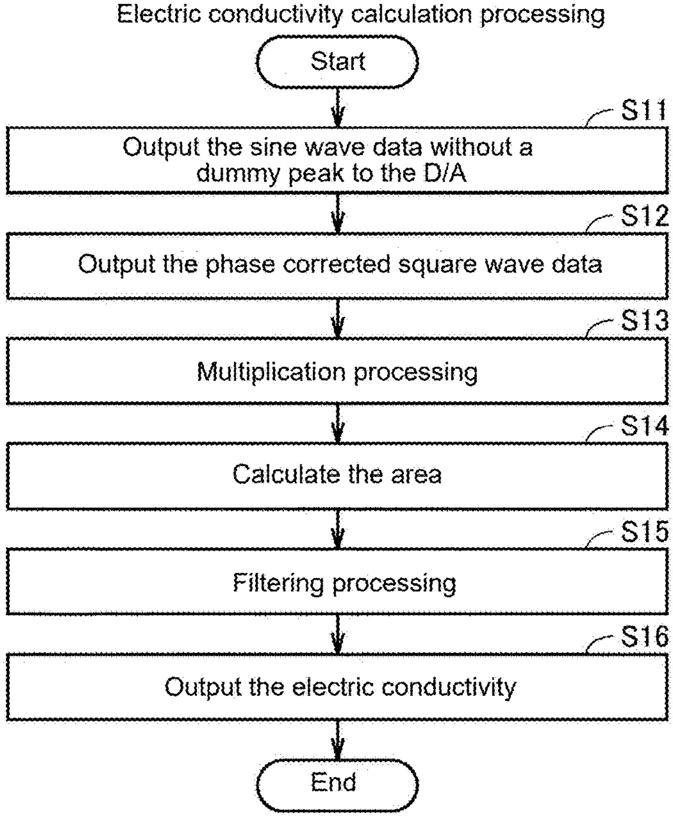
FIG. 9 is a flowchart for explaining the details of the electrical conductivity calculation processing.

FIG. 9 is a flowchart for explaining the details of the electrical conductivity calculation processing.

Initially, in Step S11, the controller 100 outputs the sine wave data without a dummy peak to the D/A converter and acquires the data of the detected wave via the cell 12 from the A/D converter 14. Then, in Step S12, the controller 100 outputs the phase-corrected square wave data, and in Step S13, it multiplies the detected wave data by the square wave data. Then, the multiplication result is integrated over half of a period or one period of the sine wave to calculate the area.

At this time, if the square wave data is not corrected, a portion where the sign of the square wave and the sign of the detected wave differ occurs as shown in FIG. 2, resulting in a negative value for the multiplication result, which in turn results in incorrect integration of the area. In this embodiment, the phase of the square wave data is corrected when multiplying the square wave data by the detected wave data. Therefore, as shown in FIG. 3, the sign of the detected wave data and the sign of the square wave data will match over the entire range, and the area can be correctly calculated by multiplying these results and then integrating them.

Then, in Step S15, filtering processing is executed, and in Step S16, the result after being converted by multiplying it by a coefficient corresponding to the size of the cell or other necessary factors as necessary is output as the electrical conductivity.

As explained above, the following effects can be obtained by the electrical conductivity detector of this embodiment.

It is not necessary to use a glitch-free D/A converter that does not produce spike noise, and it is not necessary to implement a filter circuit for spike noise removal. Therefore, it is possible to produce an electrical conductivity detector at a low cost.

The computational cost can remain almost unchanged by simply changing the input wave data, so there is no need to change the hardware (CPU, PLD, etc.), making it easy to introduce the processing for improving the accuracy of the phase correction.

Aspects

It would be understood by those skilled in the art that the exemplary embodiments described above are specific examples of the following aspects.

(Item 1)

The present disclosure relates to an electrical conductivity detector. The electrical conductivity detector is equipped with a waveform output unit for supplying an AC signal to a measurement target and a controller for controlling a waveform output unit. The controller is configured to execute multiplication processing for multiplying a detected wave acquired when the AC signal passes through the measurement target by a reference wave for detecting the electrical conductivity. The controller is configured to cause the waveform output unit to generate a waveform with a dummy peak superimposed on the input wave as an AC signal and execute phase difference detection processing for detecting a phase difference between the detected wave and the AC signal acquired correspondingly. The controller is configured to cause the waveform output unit to generate a waveform with no dummy peak superimposed on the input wave as an AC signal, execute processing for correcting the phase difference with respect to the reference wave, and execute electrical conductivity calculation processing for calculating the electrical conductivity based on the result of the multiplication processing.

According to the electrical conductivity detector as recited in the above-described Item 1, the accuracy of the correction for aligning the phase of the reference wave with that of the detected wave is improved, so the electrical conductivity can be detected with high accuracy.

(Item 2)

In the electrical conductivity detector as recited in the above-described Item 1, it may be configured such that the input wave is a sine wave, and the reference wave is a square wave.

According to the electrical conductivity detector as recited in the above-described Item 2, the accuracy of the correction for aligning the phase of the square wave, which is a reference wave, with the sine wave, which is a detected wave, is improved, which enables high accuracy detection of the electrical conductivity.

(Item 3)

In the electrical conductivity detector as recited in the above-described Item 2, it may be configured as follows. The waveform output unit includes a D/A converter. The controller is configured to transmit sine wave data to the D/A converter in the electrical conductivity calculation processing. The controller is configured to transmit the data obtained by adding data of the dummy peak to the sine wave data to the D/A converter in the phase difference detection processing.

According to the electrical conductivity detector as recited in the above-described Item 3, since a waveform is generated by the D/A converter, it is easy to switch between the presence of the superimposition of a dummy peak and the absence thereof with respect to the input wave.

(Item 4)

In the electrical conductivity detector as recited in the above-described Item 3, it may be configured such that the controller is configured, in the phase difference detection processing, to detect a peak value of the detected wave and detect the phase difference based on a delay amount from the dummy peak of the AC signal to the peak value of the detected wave.

According to the electrical conductivity detector as recited in the above-described Item 4, since a dummy peak is superimposed, the time difference between peaks is less affected by noise, resulting in improved accuracy of the correction for aligning the phase of the reference wave with the detected wave. Therefore, it is possible to detect the electrical conductivity with high accuracy.

(Item 5)

In the electrical conductivity detector as recited in the above-described Item 2, it may be configured such that the controller is configured to calculate an area of a superimposed portion between the reference wave and the sine wave by integrating the result of the multiplication processing and convert a calculated area into the electrical conductivity.

According to the electrical conductivity detector as recited in the above-described Item 5, in the case where the input signal is an AC signal, the accuracy of the correction for aligning the phase of the reference wave with the detected wave is improved. Therefore, it is possible to detect the electrical conductivity with high accuracy.

(Item 6)

In the electrical conductivity detector as recited in the above-described Item 1, it may be configured such that a height of the dummy peak is 5% or more and 15% or less of an amplitude of the AC signal.

According to the electrical conductivity detector as recited in the above-described Item 6, the dummy peak is larger than the noise and falls within a range that does not affect the AC signal. Therefore, the time difference between peaks is less affected by noise, and the electrical conductivity detection accuracy can be improved.

(Item 7)

In the electrical conductivity detector as recited in the above-described Item 6, it may be configured such that a height of the dummy peak is 10% of the amplitude of the AC signal.

According to the electrical conductivity detector as recited in the above-described Item 7, the dummy peak is larger than the noise and falls within a range that does not affect the AC signal. Therefore, the time difference between peaks is less affected by noise, and the electrical conductivity detection accuracy can be improved.

(Item 8)

In the electrical conductivity detector as recited in the above-described Item 1, it may be configured such that a width of the dummy peak is shorter than half of a period of the AC signal.

According to the electrical conductivity detector as recited in the above-described Item 8, the dummy peak is within a range that does not affect the AC signal. Therefore, the time difference between peaks is less affected by noise, and the electrical conductivity detection accuracy can be improved.

(Item 9)

In the electrical conductivity detector as recited in the above-described Item 1, it may be configured as follows. The measurement target is a sample solution for ion chromatography. The electrical conductivity detector is further provided with a cell for accommodating the sample solution. The cell includes a first electrode configured to be immersed in the sample solution and to receive the AC signal from the waveform output unit, and a second electrode configured to be immersed in the sample solution and to output the detected wave.

According to the electrical conductivity detector as recited in the above-described Item 9, the detection accuracy of the electrical conductivity used in ion chromatography can be improved.

Although some embodiments of the present invention have been described, the embodiments disclosed here should be considered in all respects illustrative and not restrictive. It should be noted that the scope of the invention is indicated by claims and is intended to include all modifications within the meaning and scope of the claims and equivalents.

The invention claimed is:

1. An electrical conductivity detector comprising:

a waveform output unit configured to supply an alternating current (AC) signal to a measurement target; and a controller configured to control the waveform output unit, wherein the controller is configured to execute multiplication processing for multiplying a detected wave acquired when the AC signal passes through the measurement target by a reference wave for detecting electrical conductivity, wherein the controller is configured to cause the waveform output unit to generate a waveform with a dummy peak superimposed on an input wave as the AC signal and execute phase difference detection processing for detecting a phase difference between the detected wave and the AC signal acquired correspondingly, and wherein the controller is configured to cause the waveform output unit to generate a waveform with no dummy peak superimposed on the input wave as the AC signal, execute processing for correcting the phase difference with respect to the reference wave for detecting electrical conductivity, and execute electrical conductivity calculation processing for calculating the electrical conductivity based on a result of the multiplication processing for multiplying the detected wave.

2. The electrical conductivity detector as recited in claim 1, wherein the input wave is a sine wave, and the reference wave for detecting electrical conductivity is a square wave.

3. The electrical conductivity detector as recited in claim 2, wherein the waveform output unit includes a Digital-to-Analog (D/A) converter, wherein the controller is configured to transmit sine wave data to the D/A converter in the electrical conductivity calculation processing, and wherein the controller is configured to transmit the data obtained by adding data of the dummy peak superimposed on the input wave to the sine wave data to the D/A converter in the phase difference detection processing.

4. The electrical conductivity detector as recited in claim 3, wherein the controller is configured, in the phase difference detection processing, to detect a peak value of the detected wave and detect the phase difference based on a delay amount from the dummy peak superimposed on the input wave of the AC signal to the peak value of the detected wave.

5. The electrical conductivity detector as recited in claim 2, wherein the controller is configured to calculate an area of a superimposed portion between the reference wave for detecting electrical conductivity and the sine wave by integrating the result of the multiplication processing for multiplying the detected wave and convert a calculated area into the electrical conductivity.

6. The electrical conductivity detector as recited in claim 1, wherein a height of the dummy peak superimposed on the input wave is 5% or more and 15% or less of an amplitude of the AC signal.

7. The electrical conductivity detector as recited in claim 6, wherein a height of the dummy peak superimposed on the input wave is 10% of the amplitude of the AC signal.

8. The electrical conductivity detector as recited in claim 1, wherein a width of the dummy peak superimposed on the input wave is shorter than half of a period of the AC signal.

9. The electrical conductivity detector as recited in claim 1, wherein the measurement target is a sample solution for ion chromatography, wherein the electrical conductivity detector is further provided with a cell for accommodating the sample solution, and wherein the cell includes a first electrode configured to be immersed in the sample solution and to receive the AC signal from the waveform output unit and a second electrode configured to be immersed in the sample solution and to output the detected wave.

* * * * *